United States Patent [19]
Gorman et al.

[11] Patent Number: 6,053,668
[45] Date of Patent: Apr. 25, 2000

[54] WATER SLIDE FOR TRANSFERRING SEMICONDUCTOR WAFERS

[75] Inventors: Andrew P. Gorman, Portland; John Howells, West Linn; Randall W. Peltola, Hillsboro, all of Oreg.

[73] Assignee: Daitron, Inc., Wilsonville, Oreg.

[21] Appl. No.: 08/920,432

[22] Filed: Aug. 29, 1997

[51] Int. Cl.[7] .................................................. B65G 53/16

[52] U.S. Cl. .............................. 406/86; 406/88; 406/89; 406/90

[58] Field of Search ................................. 406/86, 88, 89, 406/90, 72, 79, 81

[56] References Cited

U.S. PATENT DOCUMENTS 4,015,880    4/1977    Colvin et al. .............................. 406/88

*Primary Examiner*—Christopher P. Ellis
*Assistant Examiner*—Jeffrey A. Shapiro
*Attorney, Agent, or Firm*—Klarquist Sparkman Campbell Leigh & Whinston, LLP

[57] ABSTRACT

A water slide for semiconductor wafer processing minimizes water usage by confining water to flow within spaced-apart grooves in the absence of a wafer. When a wafer passes down the water slide, a meniscus of water formed above the grooves is spread out to occupy the space underneath the wafer and prevent it from contacting the water slide as the wafer travels down the water slide.

22 Claims, 5 Drawing Sheets

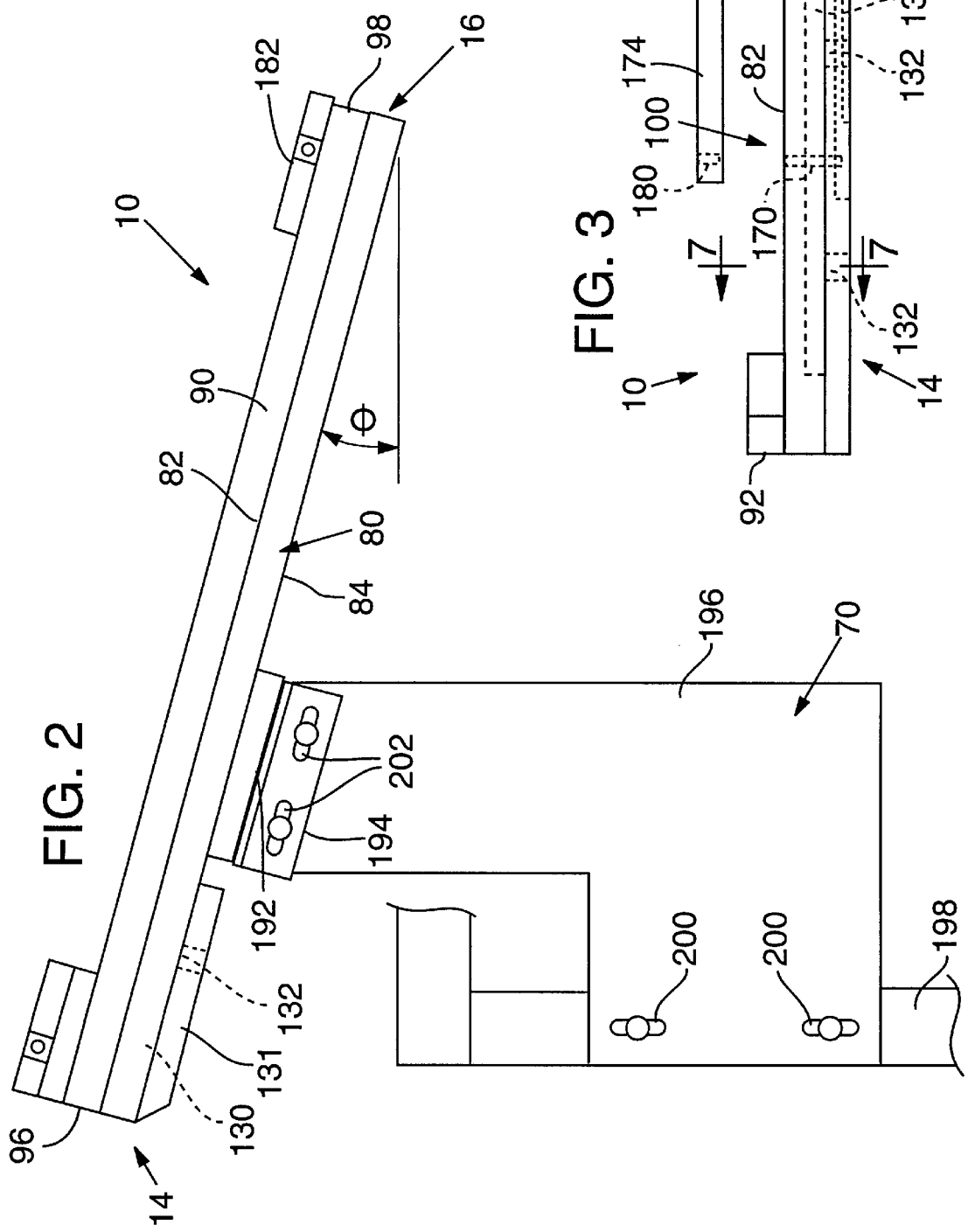

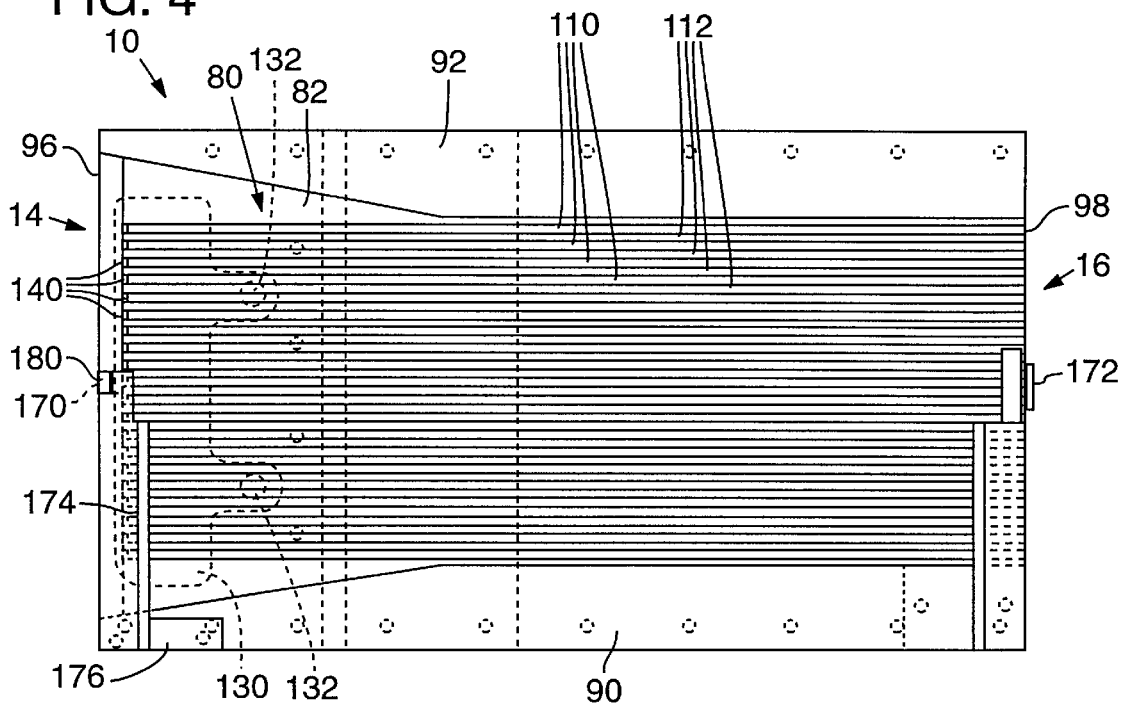
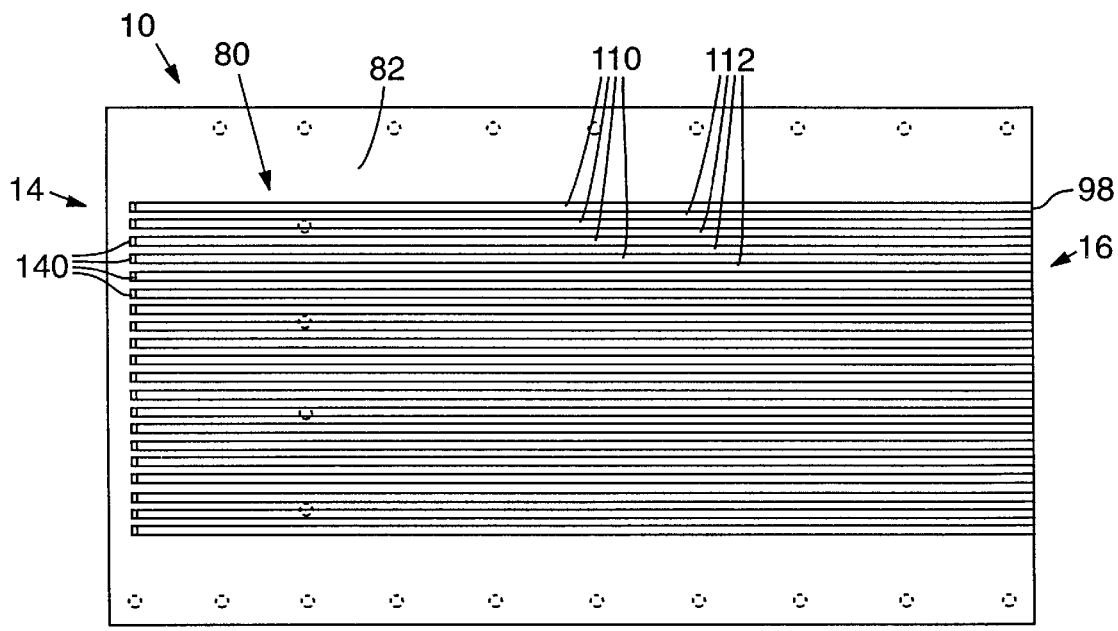

FIG. 8
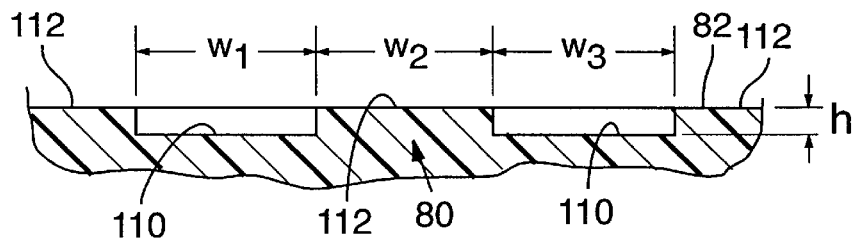
FIG. 9
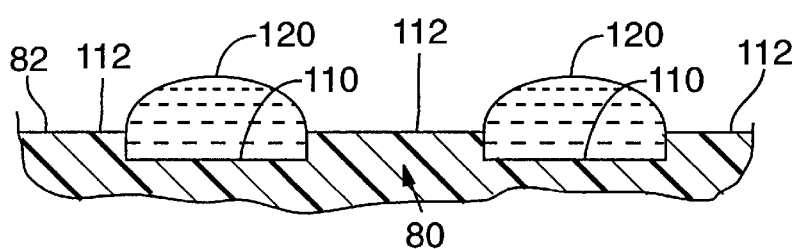
FIG. 10
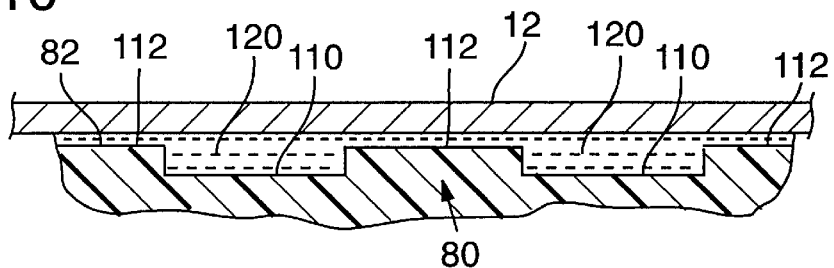
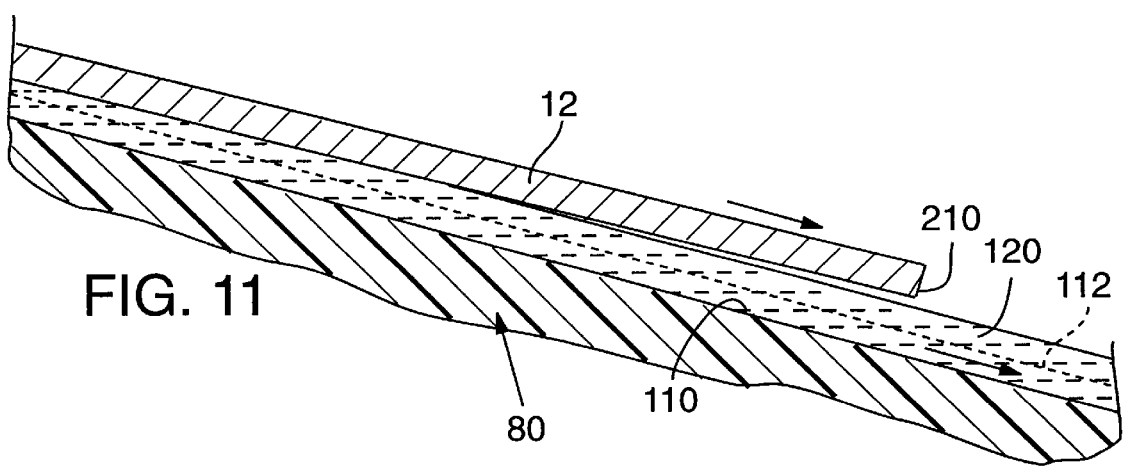
FIG. 11 ent. The body includes first and second upwardly projecting side walls which define a wafer guide channel therebetween. The body includes an upper major surface which defines the bottom of the wafer guide channel. A plurality of elongated water carrying grooves extend lengthwise along the body. These grooves are operable to channel the flow of water within the grooves with a meniscus of water projecting upwardly from the grooves in the absence of a wafer. The meniscus of water is spread from each of the grooves to wet the upper major surface beneath a wafer when the wafer passes down the water slide along the wafer guide channel.

WATER SLIDE FOR TRANSFERRING SEMICONDUCTOR WAFERS

BACKGROUND OF THE INVENTION

The present invention relates to semiconductor wafer manufacturing and more specifically to a water slide for transferring semiconductor wafers from a first location in a manufacturing process to a second location in the manufacturing process.

During semiconductor wafer manufacturing, the wafers being processed are subjected to various processing steps during their manufacture. Oftentimes, these wafers are transported in wafer cassettes. During processing, wafers from the cassettes are unloaded, for example onto a conveyor, which conveys the individual wafers through a wafer processing station where a manufacturing step takes place. Following the processing, the wafers are loaded into a cassette from the conveyor.

In one known approach, wafers are transferred from a conveyor to waiting cassettes utilizing a water slide which, during operation, provides a continuous sheet of water across the entire slide regardless of whether a wafer is present on the slide. The slide is tilted downwardly at an angle relative to horizontal so that water will flow down the slide. The water slide of this known construction has a uniformly flat planar bottom surface. As a wafer enters the top of the slide, it is supported entirely from below by the water sheet so that the undersurface of the wafer, adjacent to the upper surface of the slide, does not come in contact with the slide. Any such contact could scratch or otherwise damage the partially processed wafer. As the wafer travels down the slide, it in effect surfs on the sheet of water with the leading (downwardmost) edge of the wafer being elevated relative to the trailing edge by the water as it travels down the slide. In effect, the downwardmost edge of the wafer rides a crest of a wave that forms as the wafer rests on the sheet of water overlying the water slide and travels from the top to the bottom of the slide.

The continuous sheet of water on such a slide also reduces the possibility of wafers jamming or stopping on the slide where they may be impacted by the next wafer entering the slide from the conveyor.

In water slides known to the inventors, to minimize possible wafer damage and provide a complete sheet of water, substantial quantities of water are caused to flow down the water slide. For example, it is not unusual for these known water slide systems to use one hundred gallons of water per hour or more.

These water intensive systems are disadvantageous because relatively expensive distilled water is typically used in these applications. Moreover, water is becoming a scarcer and more costly resource. Therefore, it would be extremely advantageous to provide a water slide system which reduces water use requirements while still effectively transporting the semiconductor wafers between first and second locations in a semiconductor manufacturing process.

SUMMARY OF THE INVENTION

A water slide is described for transferring wafers from a first location, such as on a conveyor, to a second location, such as into a wafer cassette. The water slide includes an elongated body with a first end positioned adjacent to the conveyor, and a second end positioned adjacent to the wafer cassette. The body is downwardly inclined, or tilted downwardly relative to horizontal, from the first end to the second end. The body includes first and second upwardly projecting side walls which define a wafer guide channel therebetween. The body includes an upper major surface which defines the bottom of the wafer guide channel. A plurality of elongated water carrying grooves extend lengthwise along the body. These grooves are operable to channel the flow of water within the grooves with a meniscus of water projecting upwardly from the grooves in the absence of a wafer. The meniscus of water is spread from each of the grooves to wet the upper major surface beneath a wafer when the wafer passes down the water slide along the wafer guide channel.

In accordance with another aspect of the present invention, the grooves are most preferably parallel spaced-apart grooves and extend in a direction parallel to the longitudinal axis of the wafer guide channel.

As a further aspect of the present invention, the grooves are formed in the upper major surface, such as being recessed into such surface, with portions of the upper major surface adjacent to the grooves being smoother than the grooves. Consequently, water is drawn toward the grooves following the passage of a wafer along the water slide. In this manner, the grooves are more hydrophilic than the portions of the upper major surface adjacent to the grooves. Other ways of making the grooves more hydrophilic than the remainder of the wafer guide channel may also be used.

In a preferred manufacturing approach, the body has an integral or monolithic base with grooves machined into the upper surface of the base. The upper surface of the base comprises the upper major surface of the body and the ungrooved portions of the upper major surface are most preferably in a common plane.

In the approach in which the grooves are machined into the upper surface, the upper major surface outside of the grooves is a polished surface. Although variable, most preferably the roughness average of the machine grooved is in the range of from 63 to 125 microinches and the roughness of the portions of the upper surface outside the grooves is 4 to 16 microinches.

Although the grooves may be of other shapes, most preferably the grooves are rectangular in cross section. In the illustrated embodiment of the invention, the grooves have a width of from one-eighth inch to three-eighths inch and a depth from 0.01 inch to 0.025 inch, and are spaced apart a distance of from one-quarter inch to three-eighth inch. In a specifically preferred embodiment, the grooves are uniform with a width of about 0.2 inches, are spaced apart about 0.2 inches, and have a depth of about 0.02 inches.

The body is provided with a water supply manifold. Each of the grooves has a water supply port having an inlet communicating with the manifold and an outlet communicating with an upper end portion of the groove. It is preferable to provide enough water to the grooves so that, when a wafer travels down the water slide, the entire undersurface of the wafer is spaced from the water slide by a film of water. Thus, other water delivery approaches may be used. In the illustrated construction, the port has a longitudinal axis between the inlet and the outlet which is at an angle of from about thirty degrees to about sixty degrees relative to the upper major surface of the body and most preferably about forty-five degrees relative to such surface. Consequently, as water flows through the port, it is already directed to some extent in the direction of the grooves as the water exits the water port.

The water slide of the present invention has an upper major surface which is tilted downwardly at an angle relative to horizontal. Most preferably, this downward tilting is from eight degrees to twenty-five degrees, with a specifically preferred angle being about fifteen degrees.

As yet another feature of the present invention, the water slide includes a guide channel with a mouth having an entrance at the upper end of the body which tapers moving downwardly along the water slide from the mouth entrance.

Although more water may be supplied if desired, preferably less than thirty gallons per hour of water is required and most preferably no more than about fifteen to eighteen gallons of water per hour is required for the water slide of the present invention to operate.

As another advantage of the present invention, the water slide requires no moving parts.

A method of transferring a wafer in accordance with the present invention is also described, involving the step of flowing water in plural elongated defined channels, which may be discrete channels. The water flows from a first location to a second location spaced from and below the first location. In accordance with this method, a meniscus of water is formed above each of the defined channels in the absence of a wafer. This meniscus is spread from the defined channels and beneath the wafer to carry the wafer over the water slide in the first direction when a wafer is present. The water returns to the defined channels following the passage of the wafer. Most preferably, water is spread beneath the entire surface of the wafer as it passes over the water slide.

It is accordingly one object of the present invention to provide an improved water slide for wafer manufacturing applications.

It is yet another object of the invention to provide a water slide which reduces the requirement of water for its operation.

The present invention relates to the above features, advantages, and objects individually as well as collectively. That is, the invention is not limited to a combination of all of the features recited above, but instead is defined by the claims set forth below.

BRIEF DESCRIPTION OF THE DRAWINGS

FIG. 2 is a side elevational view of the water slide of FIG. 1.

FIG. 3 is an end view of the water slide of FIG. 2 looking down the water slide from the upper end thereof.

FIG. 4 is a top plan view of the water slide of FIG. 1.

FIG. 5 is a top plan view of a water channel defining plate in accordance with one form of the present invention.

FIG. 8 is a vertical sectional view taken transversely across a portion of the base of the water slide of FIG. 1 to illustrate several of the grooves included in the water slide.

FIG. 9 is a schematic representation of the meniscus of water which forms above the grooves in the absence of a wafer.

FIG. 10 is a schematic representation of the flattening of the meniscus of water and spreading of the water across the surface of the water slide and beneath a wafer when a wafer is present.

FIG. 11 illustrates schematically the raising of the lower or downwardmost edge of a wafer as it travels down the water slide of the present invention.

DETAILED DESCRIPTION OF A PREFERRED EMBODIMENT

For purposes of convenience, the description proceeds with reference to an embodiment of the invention shown in the figures. It is to be understood that the invention is not limited to the specific embodiment shown by these figures as described below.

Figure 1:
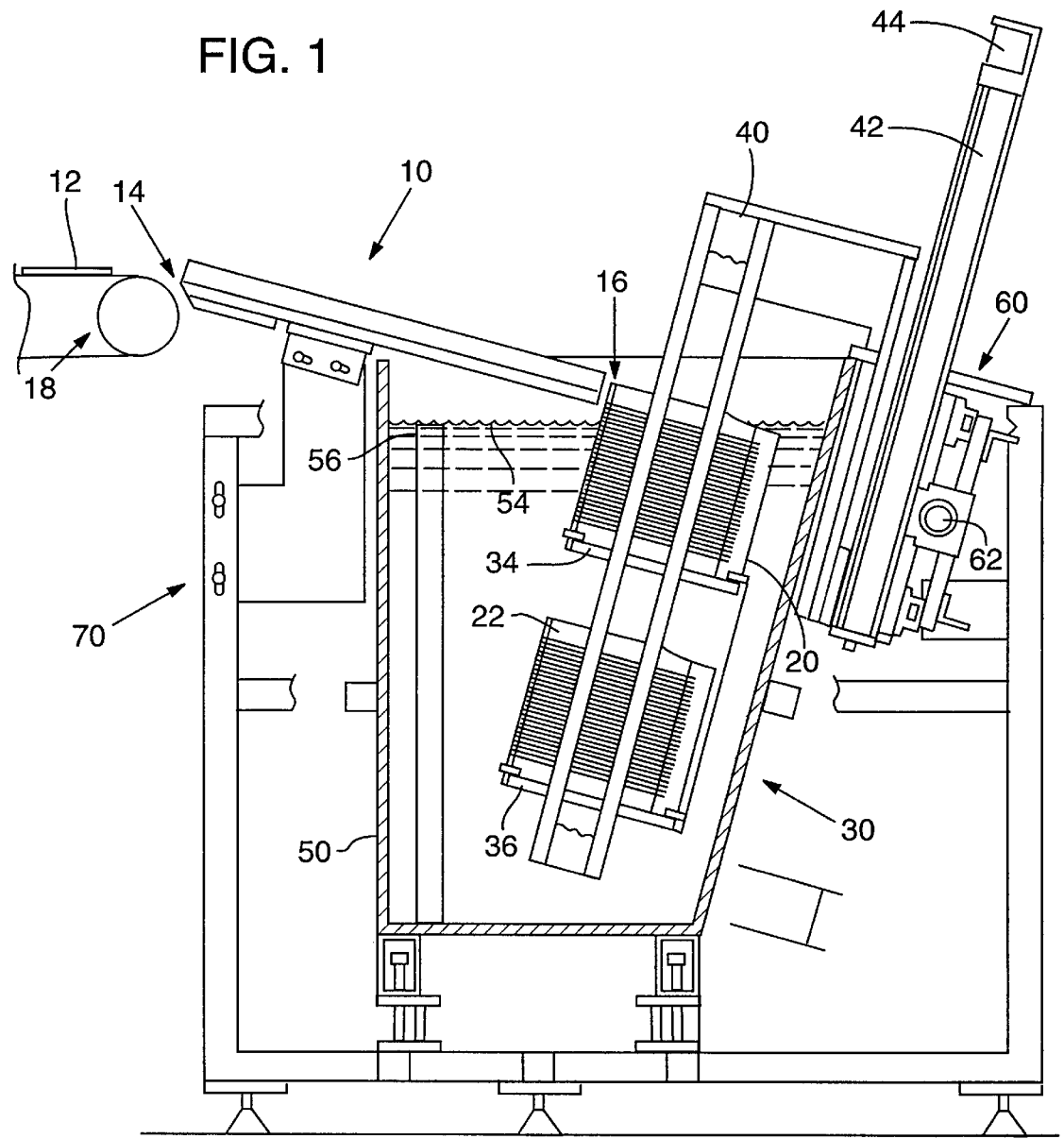
FIG. 1 is a side elevation view of a water slide in accordance with the present invention shown in the context of a wafer processing application.

With reference to FIG. 1, a water slide 10 in accordance with the present invention is shown for conveying semiconductor wafers, such as a schematically illustrated wafer 12, between locations in a semiconductor manufacturing process line. In FIG. 1, the water slide delivers wafers from a first location 14 in the process line to a second location 16. In the illustrated example, the wafer 12 is shown being transported by a wafer conveyor 18 which terminates at the first location 14. In addition, a wafer receiving cassette 20 is supported at the location 18. In a conventional manner, cassette 20 has a plurality of wafer receiving slots, each for receiving a semiconductor wafer.

Wafer cassette 20 is supported by an elevator 30 which indexes the wafer cassette to position an empty wafer receiving slot at the base of the water slide in alignment to receive a wafer which travels down the water slide between the first and second locations 14, 16. The elevator 30 indexes the wafer cassette 20, and another similar cassette 22 positioned below the cassette 20, to repetitively position an empty slot at the base of the slide for receiving the next wafer. The respective cassettes 20, 22 in this example are each supported by a respective plate 34, 36 mounted to a frame 40 of the elevator assembly. The frame 40 is supported by a ball screw 42, such as a LinTech Model M1-104424 CP ball screw mechanism, operated by a stepper motor 44 to index the elevator and move the wafer cassette slots into position. A shaft encoder and optional feedback encoder may be used to control and monitor the position of the ball screw. The wafer cassettes are supported by the frame 40 within a tank 50 filled with water to a level 54. An overflow spout 56 prevents the water from rising above a desired level in the tank.

The illustrated elevator assembly 30 may also be coupled to a slide frame 60 which permits the elevator to be shifted from side to side in the tank. Consequently, multiple stacks of wafer cassettes may be supported in the tank and shifted, for example by a pneumatic cylinder 62, transversely within the tank to position the desired stack of cassettes at the wafer receiving location. One suitable cylinder is a Model DGO-40-350-PPV-15226 air actuated positioning cylinder from Festo Corporation. Conventional linear bearings may be used to guide the transverse motion of the slide frame 60 and also the upright motion of the elevator as it is indexed by the ball screw or other suitable indexing device.

Any suitable wafer delivery and receiving apparatus may be used in conjunction with the water slide of the present invention, with the delivery apparatus presenting a wafer to the upper end of the water slide, and the receiving apparatus collecting wafers from the lower end of the water slide. Thus, the wafer processing line environment of FIG. 1 may be altered without detracting from the present invention.

With reference to FIGS. 2–4, the illustrated water slide 10 is supported by a frame 70 described in greater detail below. The water slide 10 includes an elongated base 80 having an upper surface 82 and an undersurface or bottom surface 84.

The base is preferably a monolithic plate-like structure with the upper surface 82 being smooth, flat, and planar. First and second side rails 90, 92 are positioned to extend lengthwise along the base 80 from an upper end 96 of the base to a lower end 98 of the base. The side rails 90, 92 together with the upper surface 82 of base 80 define a wafer guide channel extending between the ends 96, 98 of the base. As can be seen in FIG. 4, the adjacent side edges of the rails 90, 92 diverge away from one another moving toward the upper end 96 of the base. In other words, rails 90, 92 are tapered in the direction moving toward end 96 to thereby define an entrance opening 100 at the upper end of the water slide which is wider than the distance between the rails 90, 92 at the bottom end of the water slide. Consequently, if any wafers are slightly off-center as they leave the conveyor, they will be guided by the rails toward the center of the slide.

A plurality of water carrying grooves 110 are provided in the upper surface 82 of the base 80. These grooves may be defined in any convenient manner, such as by mounting strips to the upper surface with the grooves being defined between these strips. However, in the preferred embodiment of the invention, the grooves 110 are recessed into the base surface 82 and are separated by lands 112 which, in the illustrated embodiment, are in the plane of the upper surface 82 of base 80.

As best seen in FIG. 4, the illustrated grooves 110 are preferably parallel and spaced apart. These grooves extend in a direction which is also parallel to the longitudinal axis of the base 80. The grooves in the illustrated embodiment each start at a location spaced a short distance (e.g. about one-fourth to one-half inch) from the upper end of the water slide and extend continuously to the lower end of the slide. Although the illustrated pattern of grooves is advantageous, other arrangements of grooves which carry sufficient water to support wafers on water above the surface 82 of the water slide may be used.

The grooves 110 may be formed in any convenient manner. However, in the illustrated embodiment they are preferably formed by precision machining. To facilitate machining and to provide a surface which is wear-resistant and which minimizes the potential of contaminants wearing from the water slide, the water slide is preferably of a durable easily machined material such as acrylic plastic. As a specific example, black acrylic plastic such as Plexiglas® plastic with carbon black therein may be used. The invention, however, is not limited to a specific type of material.

This material is supplied with a surface which is smooth and polished in appearance. Consequently, water droplets which impinge on this surface bead up to form a meniscus. The grooves 110 which are machined into the surface have a rougher texture than the lands 112 or smooth unmachined surfaces. Consequently, the grooves are more hydrophilic than the land portions of the upper major surface adjacent to the grooves. As a result, water flowing down the water slide tends to be drawn into the grooves 110 and away from the land portions 112 of the surface 82. This is illustrated in FIG. 9, which schematically represents a meniscus of water 120 which projects above surface 82 in the region of each groove 110 as water flows down the groove. The water is drawn away from the lands 112 and collects in the grooves.

Thus, in accordance with the present invention, the grooves are more hydrophilic than the portions of the upper major surface adjacent to the grooves. Other ways may be utilized to make grooves which are more hydrophilic than the adjacent lands. For example, the lands could be polished to a higher degree than the grooves and different materials or coatings may be used for the lands and grooves.

In the specifically illustrated embodiment, the grooves are machined with an average roughness in the range of from 63 to 125 microinches. The average roughness involves a determination of the measured surface from the nominal surface. Conversely, the lands have a roughness ranging from 4 to 16 microinches.

Although this may be varied, with reference to FIG. 8, the grooves 110 in the illustrated embodiment are rectangular in cross section. The grooves 110 are most preferably uniform and uniformly spaced apart, having a width $W_1$ of $W_3$ or from one-eighth inch to three-eighth inch, a depth h of from 0.01 inch to 0.025 inch, and are spaced apart from edge to edge, a distance $W_2$, from one-fourth inch to three-eighth inch. As a specific preferred embodiment, the grooves have a width of about 0.2 inches, are spaced apart about 0.2 inches, and have a depth of about 0.02 inches. In a specifically constructed embodiment of the present invention, the grooves were 0.195 inch wide, spaced apart 0.195 inch, and had a depth of 0.016 inch.

Referring again to FIG. 2, the water slide is tilted downwardly at an angle θ relative to horizontal. Although variable, the angle θ is preferably from about eight degrees to about twenty-five degrees from horizontal, with fifteen degrees from horizontal being a specifically preferred example.

Figure 6:
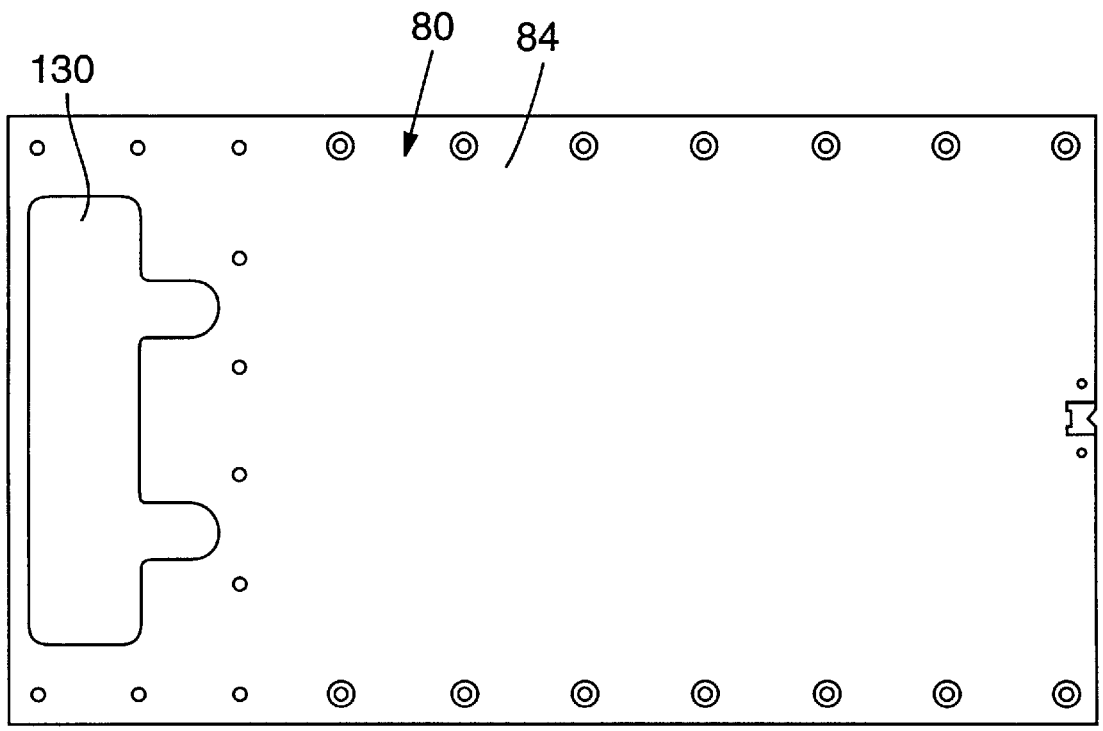
FIG. 6 is a bottom view of the plate of FIG. 5.

With reference to FIGS. 2, 3, 4, and 6, the base 80 is provided with a water supply manifold 130 which is preferably recessed into the underside of the base (see FIG. 6). As best seen in FIG. 2, a cover plate 131 is mounted to the undersurface 84 of the base to close the water supply manifold from below. A pair of spaced-apart water supply inlets 132 communicate with the manifold 130 for delivery of water to the manifold. A water supply port communicates respectively between each of the grooves 110 and the water supply manifold 130. Some of the water supply parts are numbered as 140 in FIG. 4. Consequently, water delivered to the manifold flows through the respective water supply ports 140 and into the grooves of the water slide. The water supply ports 140 are also visible in the plate 80 shown in FIG. 5.

Figure 7:
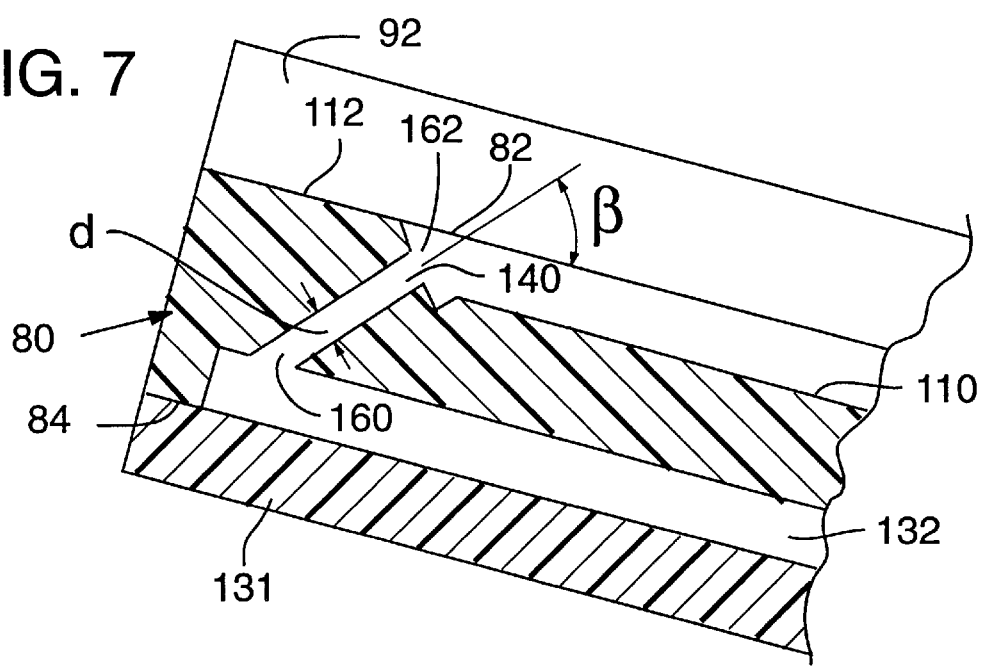
FIG. 7 is a partially broken-away vertical sectional view, taken along line 7—7 of FIG. 3, which illustrates a water supply port for delivering water from a manifold to one of the water carrying grooves.

With reference to FIG. 7, the water supply ports each have an inlet 160 communicating with the manifold 132 and an outlet 162 communicating with the upper end portion of an associated groove 110. Most preferably, the longitudinal axis of the water supply port 140 is angled relative to the plane of the upper surface 82 of the body 80, with the angle being indicated as β in FIG. 7. Consequently, water entering the grooves has a significant component of flow velocity directed along the length of the groove. Most preferably, β is an acute angle from about thirty degrees to about sixty degrees, and most preferably in a specific embodiment is forty-five degrees.

Sensors may be utilized to detect the delivery of a wafer to the water slide and to detect the exiting of the wafer from the slide. As a specific example, optical sensors may be used for this purpose. In a specific form, a light transmitter 170 (FIG. 3) may be positioned along the longitudinal centerline of the water slide at the upper end 96 of the body 80. In addition, a light emitting transmitter 172 may be positioned at the bottom end 98 of the water slide and centered in the middle of the water slide.

As shown in FIG. 3, a sensor supporting arm 174 is positioned above the light transmitter 170. A spacer 176 is positioned between the undersurface of arm 174 and the upper surface of side rail 90 to provide added clearance between the arm and the upper surface 82 of the body 80. A light detector 180 is mounted to the arm 174 in a position above the light emitter 170. Whenever the beam between emitter 170 and detector 180 is broken, the detector 180 transmits a signal to a controller to thereby sense and indicate that a wafer has entered the water slide. A similar arm 182 is positioned at the bottom end 98 of the water slide and overhangs the light emitter 172. The arm 182 supports a light detector operable in the same manner as the sensor 180 to transmit a signal to a controller whenever the beam between the emitter 172 and detector is broken.

A spacer, such as spacer 176, is typically not required at the lower end of the water slide, as wafers at the lower location are traveling in a direction generally parallel to the surface 82. In contrast, as wafers leave the conveyor and enter the upper end of the slide, the wafers change orientation relative to horizontal. The spacer 176 provides greater clearance to allow the wafers to change orientation as they commence traveling down the water slide. By detecting the entry and exit of wafers from the water slide, one can determine, for example, whether a wafer is present on the water slide and the unlikely event that wafers have jammed on the water slide (for example, if multiple wafers are detected as entering the water slide and fewer wafers are detected as exiting the water slide over a given time period).

A mounting plate 192 (FIG. 2) is secured to the undersurface 84 of the body 80. A mounting bracket 194 is coupled to a flange 196, with the flange 196 being supported by a post 198. The bracket 194 is fastened to the mounting plate 192 to support the water slide at the desired elevation and in the desired position. Elongated slots 200 are provided in flange 196 at the location where the flange is coupled to the post 198 to provide free play for vertical adjustment of the elevation of the water slide. Similarly, elongated slots 202 couple the bracket 194 to the flange 196 to provide free play for horizontal adjustment of the water slide. Each side of the water slide is typically coupled to the frame in the same manner.

Although the water slide may be assembled in any convenient manner, most preferably threaded fasteners are utilized for this purpose. Alternatively, adhesive or some combination of adhesive and mechanical fasteners may be used.

The water slide of the present invention advantageously minimizes the amount of water required to carry semiconductor wafers from one end of the slide to the other. For example, although more water may be used, in one water slide constructed in accordance with the present invention, this water slide having a length of 540 mm, a water guide channel width of 210 mm, and 20 grooves, only fifteen to eighteen gallons of water per hour was required to successfully operate the water slide. Preferably, less than thirty gallons of water per hour is required, and most preferably no more than about fifteen to eighteen gallons per hour is required. In this specific example, the water ports were circular in cross section with a diameter d (FIG. 7) of the water supply port 140 being 0.0625 inch. This compares with water usage of one hundred gallons or more for conventional water slides in which a sheet of water is continuously maintained across the entire surface of the water slide.

With reference to FIGS. 9–11, in operation and in the absence of a wafer on the water slide, water flowing down the slide is drawn into the respective grooves 110 and away from the lands 112. A traveling meniscus of water 120 is formed above each of the grooves. As a wafer passes down the water slide, as represented in FIG. 10, the meniscus 120 above each groove is flattened and spreads so that the lands 112 between the grooves 110 are covered with a layer of water. Most preferably, the entire undersurface of the wafer 12 is wetted by water and thus supported away from the upper surface 82 of the body 80 of the water slide. As represented in FIG. 11, the wafer 12, in effect, surfs down the water slide. The downwardmost edge of the wafer rides on the crest of water formed as the downwardmost edge 210 of the wafer encounters the meniscus 120 above each of the grooves. Following the passage of the wafer, due to the hydrophilic nature of the grooves 110, water flows off the lands and collects in the grooves. It should be noted, however, that the present invention is not limited to any specific theory of operation of the invention.

With this construction, one need not continuously maintain a sheet of water across the entire surface of the water slide. Consequently, water usage is substantially reduced.

Having illustrated and described the principles of the invention with reference to a preferred embodiment, it should be apparent to those of ordinary skill in the art that the invention may be modified in arrangement and detail without departing from such principles. We claim as our invention all such modifications as fall within the scope of the following claims.

We claim:

1. A water slide for transferring at least one wafer from a conveyor to a wafer cassette comprising:

an elongated body having a first end positioned adjacent to the conveyor and a second end positioned adjacent to the cassette, the body being downwardly inclined relative to horizontal from the first end to the second end;

the body including first and second upwardly projecting sidewalls which define a wafer guide channel therebetween having a bottom, the body also including an upper major surface which defines the bottom of the wafer guide channel; and a plurality of elongated water carrying grooves extending lengthwise along the body, the grooves being operable to channel a flow of water within the grooves with a meniscus of the water projecting upwardly from the grooves in the absence of the wafer and with the meniscus flowing from the grooves and wetting the upper major surface beneath the wafer when the wafer passes along the water slide and within the wafer guide channel.

2. A water slide according to claim 1 in which the water carrying grooves are parallel spaced-apart water carrying grooves.

3. A water slide according to claim 1 in which the body further has an integral base having an upper surface and wherein the water carrying grooves are machined into the upper surface of the base.

4. A water slide according to claim 1 in which the upper major surface of the body is planar.

5. A water slide according to claim 1 in which the grooves are recessed into the upper major surface and wherein portions of the upper major surface adjacent to the grooves are smoother than the grooves such that the water is drawn toward the grooves following the passage of the wafer along the water slide.

6. A water slide according to claim 1 in which the grooves are more hydrophilic than portions of the upper major surface adjacent to the grooves.

7. A water slide according to claim 1 in which the grooves are rectangular in cross section.

8. A water slide according to claim 1 in which the grooves are machined into the upper surface and the upper major surface outside the grooves is polished.

9. A water slide according to claim 1 in which the roughness of the grooves is in the range of from 63 to 125 microinches and the roughness of the portions of the upper surface outside the grooves is 4 to 16 microinches.

10. A water slide according to claim 1 in which the body further has a water supply manifold and the grooves each have a water supply port having an inlet communicating with the manifold and an outlet communicating with an upper end portion of the groove thereof, the port having a longitudinal axis between the inlet and the outlet which is at an angle of from about thirty degrees to about sixty degrees relative to the upper major surface of the body.

11. A water slide according to claim 1 wherein the grooves have a width of from one-eighth inch to three-eighth inch, a depth from 0.010 inch to 0.025 inch, and are spaced apart a distance of from one-fourth inch to three-eighth inch.

12. A water slide according to claim 1 wherein the upper major surface is tilted downwardly at an angle of from eight degrees to twenty-five degrees from horizontal.

13. A water slide according to claim 1 in which the guide channel has a mouth with an entrance at the upper end of the body which tapers moving downwardly along the water slide from the mouth entrance.

14. A water slide according to claim 1 in which the grooves have a rougher surface than portions of the upper surface adjacent to the grooves, the grooves have a width of about 0.2 inches, are spaced apart about 0.2 inches, have a depth of about 0.02 inches, and wherein the upper major surface is planar and angled downwardly at about fifteen degrees relative to horizontal.

15. A water slide according to claim 14 in which the grooves are of a rectangular cross section and are machined into the upper major surface, the upper major surface having a monolithic structure, the body further having a water supply manifold and a respective water supply port for each groove, each water supply port having an inlet communicating with the manifold and an outlet communicating with an upper end portion of the respective groove, and wherein each water supply port has a longitudinal axis between the inlet thereof and the outlet thereof which is at an angle of about forty-five degrees relative to horizontal.

16. A water slide for transferring at least one wafer downwardly from a first location to a second location below the first location, the water slide comprising:

an elongated body extending between the first and second locations;

the body having an upper major surface along which the wafer slides as the wafer travels from the first to the second locations;

a plurality of water channels extending in a lengthwise direction along the body; and the water channels being formed to collect water with a water meniscus forming above each water channel in the absence of the wafer on the water slide and with the water meniscus wetting the upper major surface beneath the wafer traveling down the water slide.

17. A water slide according to claim 16 in which the water channels comprise discrete spaced-apart water channels.

18. A water slide according to claim 17 in which the water channels comprise grooves machined into the upper major surface of the body and wherein the upper major surface of the body is a planar polished surface.

19. A water slide according to claim 18 in which the body further includes side edge portions and upright walls positioned along the respective side edge portions of the body which define a wafer guide channel therebetween.

20. A water slide according to claim 16 supplied with no more than about fifteen to eighteen gallons of the water per hour dispersed to flow along the water channels.

21. A method of transferring a wafer in a first direction from a first location to a second location spaced from and below the first location, the method comprising:

flowing water in elongated defined channels downwardly in the first direction;

forming a meniscus of the water above the defined channels in the absence of the wafer;

spreading the meniscus of the water from the defined channels and beneath the wafer to carry the wafer over the defined channels in the first direction; and returning the water to the defined channels and again forming the meniscus of the water above the defined channels following the passage of the wafer.

22. A method according to claim 21 in which the spreading step comprises the step of spreading the water beneath the entire surface of the wafer.

* * * * *